United States Patent [19]
Ko et al.

[11] Patent Number: 5,940,269
[45] Date of Patent: Aug. 17, 1999

[54] HEAT SINK ASSEMBLY FOR AN ELECTRONIC DEVICE

[75] Inventors: Ching-Rong Ko; Te-Wei Liu, both of Hsinchu, Taiwan

[73] Assignee: D-Link Corporation, Hsinchu, Taiwan

[21] Appl. No.: 09/166,138

[22] Filed: Oct. 2, 1998

[30] Foreign Application Priority Data

Feb. 10, 1998 [TW] Taiwan ................................. 87201906

[51] Int. Cl.⁶ ...................................................... H05K 7/20
[52] U.S. Cl. .......................... 361/697; 361/699; 361/704; 361/707; 361/709; 361/710; 165/80.3; 165/122; 165/185; 174/16.3; 257/707; 257/713; 257/718
[58] Field of Search ........................... 361/683, 690–697, 361/700–705, 720, 710, 721; 257/707–721; 165/80.3, 121, 106.33, 122, 185, 80.2, 80.4, 104, 32, 104.33; 62/3.3; 174/16.3

[56] References Cited

U.S. PATENT DOCUMENTS 5,173,839  12/1992  Metz ........................................ 361/387
5,396,403  3/1995  Patel ........................................ 361/705
5,689,404  11/1997  Katsui ...................................... 361/697

*Primary Examiner*—Leo P. Picard
*Assistant Examiner*—Michael Datskovsky
*Attorney, Agent, or Firm*—Bacon & Thomas, PLLC

[57] ABSTRACT

A heat sink assembly including a heat sink having a plurality of equi-distantly spaced cooling fins. The heat sink body has a depression on one side for receiving a cooling and is fixedly provided above integrated circuits of the electronic product, with a layer of thermal conductive plate disposed therebetween. The heat generated by the integrated circuit elements during operation process is transferred to the cooling fins via the thermal conductive plate. Simultaneously, the cooling fan draws in air, which is discharged, via an air outlet thereof towards the cooling fins to dissipate the heat of the cooling fins. The cooling fan can be disposed directly above the heat sink body to enhance heat dissipation efficiency. A single cooling fan will suffice to achieve good heat dissipating effects, thus reducing manufacturing cost.

5 Claims, 4 Drawing Sheets

5,940,269

HEAT SINK ASSEMBLY FOR AN ELECTRONIC DEVICE

BACKGROUND OF THE INVENTION (a) Field of the Invention:

The present invention relates to a heat sink assembly for an electronic product, and more particularly to a heat sink device that can enhance heat dissipation efficiency considerably. Besides, one cooling fan will be sufficient to achieve good heat dissipating effects, thus reducing cost.

(b) Description of the Prior Art:

Ordinary electronic products, such as network hubs have to be equipped with cooling fans or cooling fins to dissipate the high heat generated by components, such as IC controllers, during the operation process. In the prior art, the cooling fins are fixedly mounted above the IC controller, and more than one cooling fan is mounted on the housing of the network hubs. However, since there is a certain distance from the mounting position of the cooling fan to the IC controller, the heat dissipating effect is not very satisfactory. And if the cooling fan is directly mounted above the cooling fins, it cannot match the height of the network hubs. If more than two cooling fans are mounted, the manufacturing cost of the hubs will be increased and the selling price thereof will then be raised.

SUMMARY OF THE INVENTION

A primary object of the present invention is to provide a heat sink device in an electronic product. According to the present invention, the heat sink device essentially has a heat sink body. The heat sink body includes a plurality of equidistantly spaced cooling fins. The heat sink body has a depression on one side for receiving a cooling fan. The heat sink body is fixedly provided above integrated circuits of the electronic product, with a layer of thermal conductive plate disposed therebetween. The heat generated by the integrated circuit elements during operation process is transferred to the cooling fins via the thermal conductive plate. Simultaneously, the cooling fan draws in air, which is discharged, via an air outlet thereof towards the cooling fins to dissipate the heat of the cooling fins. The cooling fan can be disposed directly above the heat sink body to enhance heat dissipation efficiency. Besides, as the cooling fan is located between the cooling fins and at the same height as the cooling fins, the height of the housing of the electronic product will not be affected. Furthermore, one cooling fan will be sufficient to achieve good heat dissipating effects to thereby lower cost.

Another object of the present invention is to provide a heat sink device in an electronic device, in which there is a layer of thermal conductive plate between the integrated circuits and the heat sink body. The thermal conductive plate will not only be used as a medium for conducting heat, but also be used for balancing purposes to alleviate distance when the heat sink body is placed above two integrated circuit elements of varying heights, so that the heat sink body can be mounted in the electronic product in a stable manner.

BRIEF DESCRIPTION OF THE DRAWINGS

The foregoing and other features and advantages of the present invention will be more clearly understood from the following detailed description and the accompanying drawings, in which.

DETAILED DESCRIPTION OF THE PREFERRED EMBODIMENT

Figure 1:
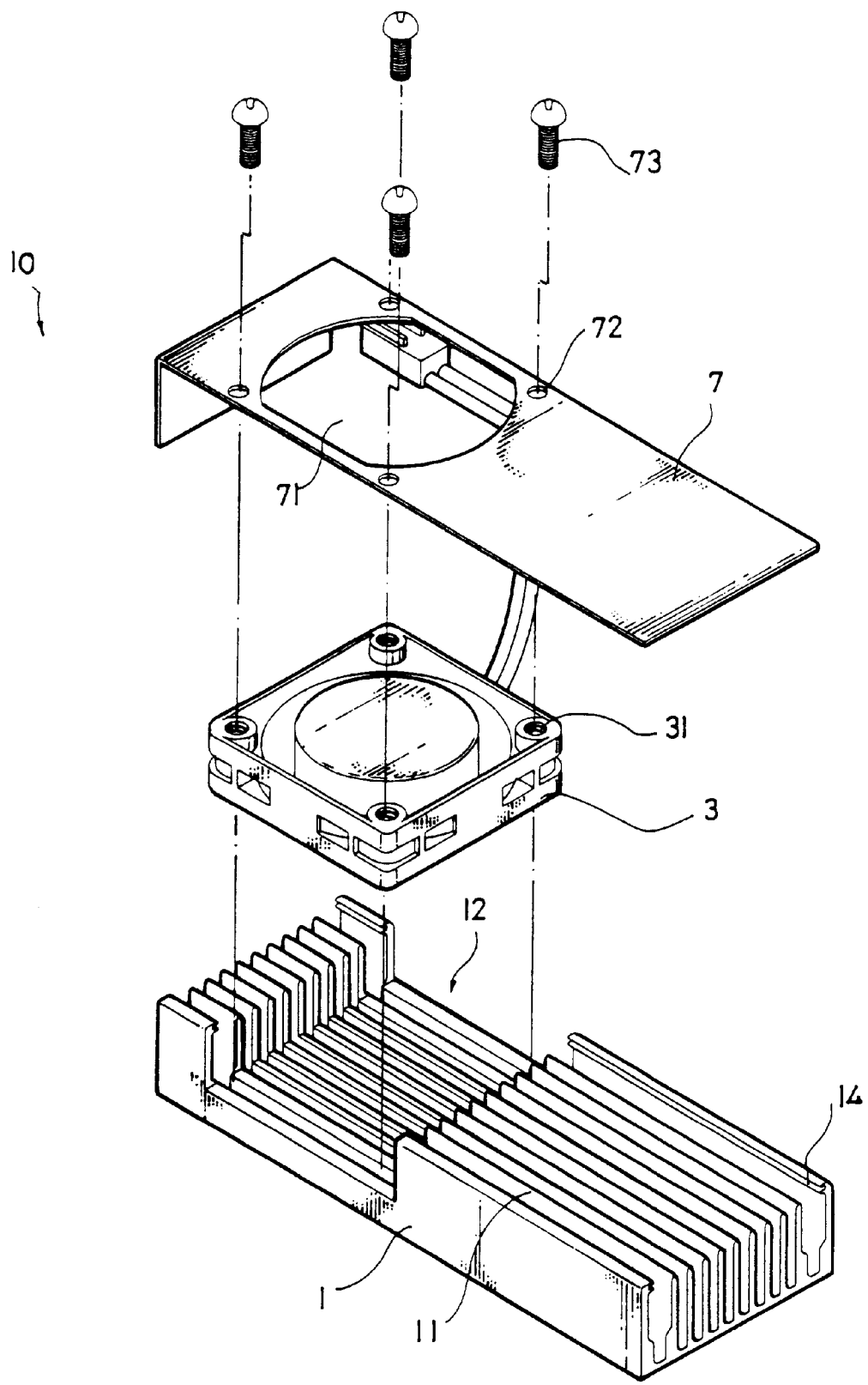
FIG. 1 is a perspective exploded schematic view of the first preferred embodiment of the present invention.
Figure 2:
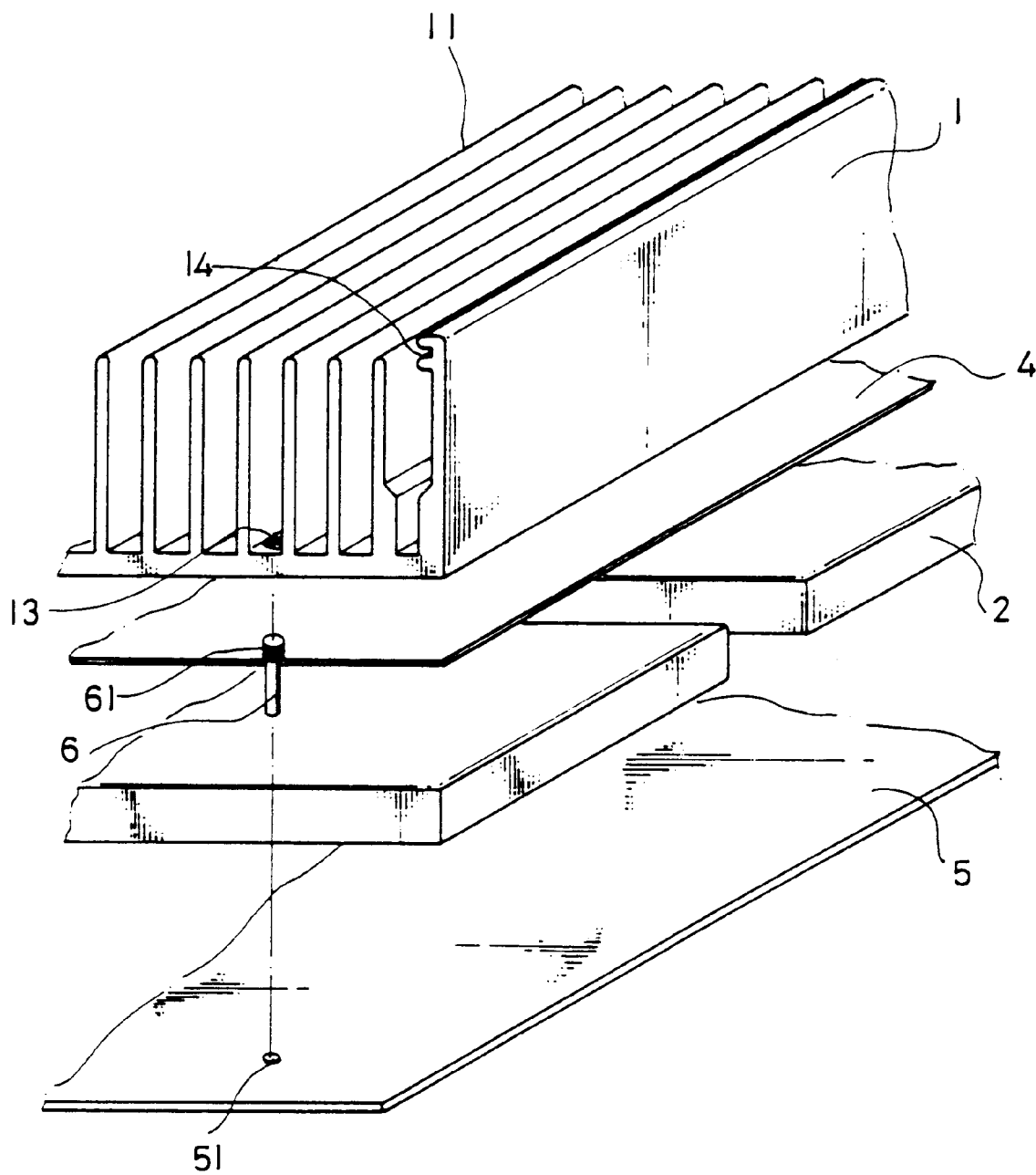
FIG. 2 is a schematic view of the structure of the first preferred embodiment of the present invention in part.

With reference to FIG. 1 and 2, the present invention is directed to a heat sink assembly for electronic products. According to the first preferred embodiment of the present invention, a heat sink assembly 10 comprises a heat sink body 1 that is mounted above integrated circuit (IC) elements of an electronic product. In the present embodiment, the IC elements are two ASIC controllers 2. The heat sink body 1 includes a plurality of equidistantly spaced cooling fins 11. One side of the heat sink body 1 has a depression 12. Additionally, there is provided a cooling fan 3 at the depression 12. When the cooling fan 3 is placed at the depression 12, it is at the same height as the cooling fins 11. Furthermore, there is provided a layer of thermal conductive plate 4, which is thermal conductive silicon. The thermal conductive silicon and the heat sink body 1 are adhered together by a double-sided adhesive (not shown), but they are not adhered to the IC controllers 2. The thermal conductive plate 4 is used as a medium for conducting heat. At the same time, when the heat sink body 1 is placed above two IC controllers 2 at different height, the thermal conductive plate 4 can be used for balancing purposes to alleviate the distance therebetween, so that the heat sink body 1 can be secured in the electronic product in a stable manner.

With reference to FIG. 2, when it is desired to mount the heat sink body 1 above the IC controllers 2, the left and right sides of the heat sink body 1 are respectively provided with a through screw hole 13, and through holes 51 corresponding to the screw holes 13 are formed on a circuit board 5 soldered to the IC controllers 2. In addition, there is provided a securing element 6, which is a copper rod. One end of the copper rod is formed with threads 61 for locking within the screw hole 13 of the heat sink body 1, with the other end inserted into the through hole 51 of the circuit board 5. The heat sink body 1 is then secured above the IC controllers by using tin soldering.

Figure 3:
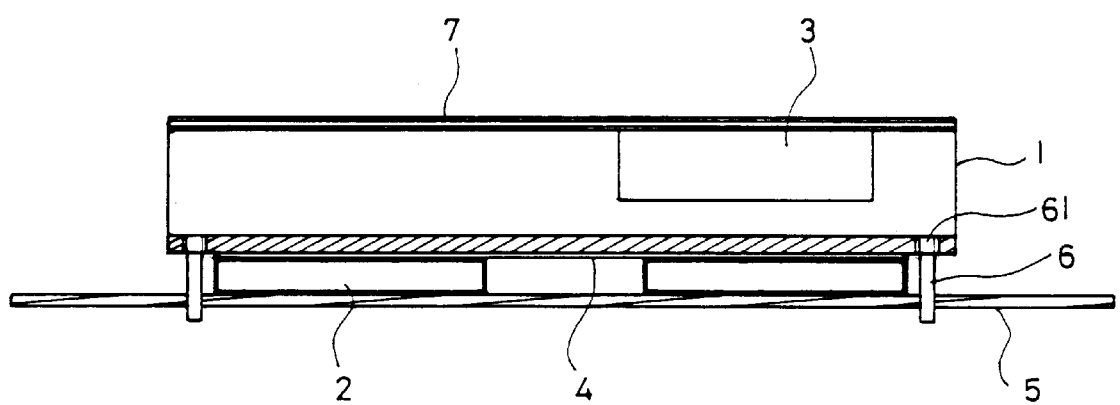
FIG. 3 is an assembled sectional schematic view of the first preferred embodiment of the present invention.

Referring to FIG. 3, when it is desired to install the heat sink device 10, the cooling fan 3 is mounted at the depression 12 of the heat sink body 1, such that the air outlet of the cooling fan 3 faces the cooling fins 11. Then, the heat sink body 1 is fixedly provided on the IC controllers 2, with the thermal conductive plate 4 adhered therebetween. At this time, the end of the copper rod with the threads 61 is locked in the screw hole 13 of the heat sink body 1, with the other end inserted into the through hole 51 of the circuit board 5. And by using tin soldering to secure the copper rod and the circuit board 5 together, the heat sink body can be securely provided above the IC controllers, thus accomplishing installation of the heat sink device 1. Therefore, the heat generated by the IC controllers 2 will be conducted via the thermal conductive plate 4 to the cooling fins 11 of the heat sink body 1. At the same time, the cooling fan 3 will induce air and discharges it via the air outlet towards the cooling fins 11 to cause the hot air to be discharged from the cooling fins 11, thus achieving the object of heat dissipation.

Figure 4:
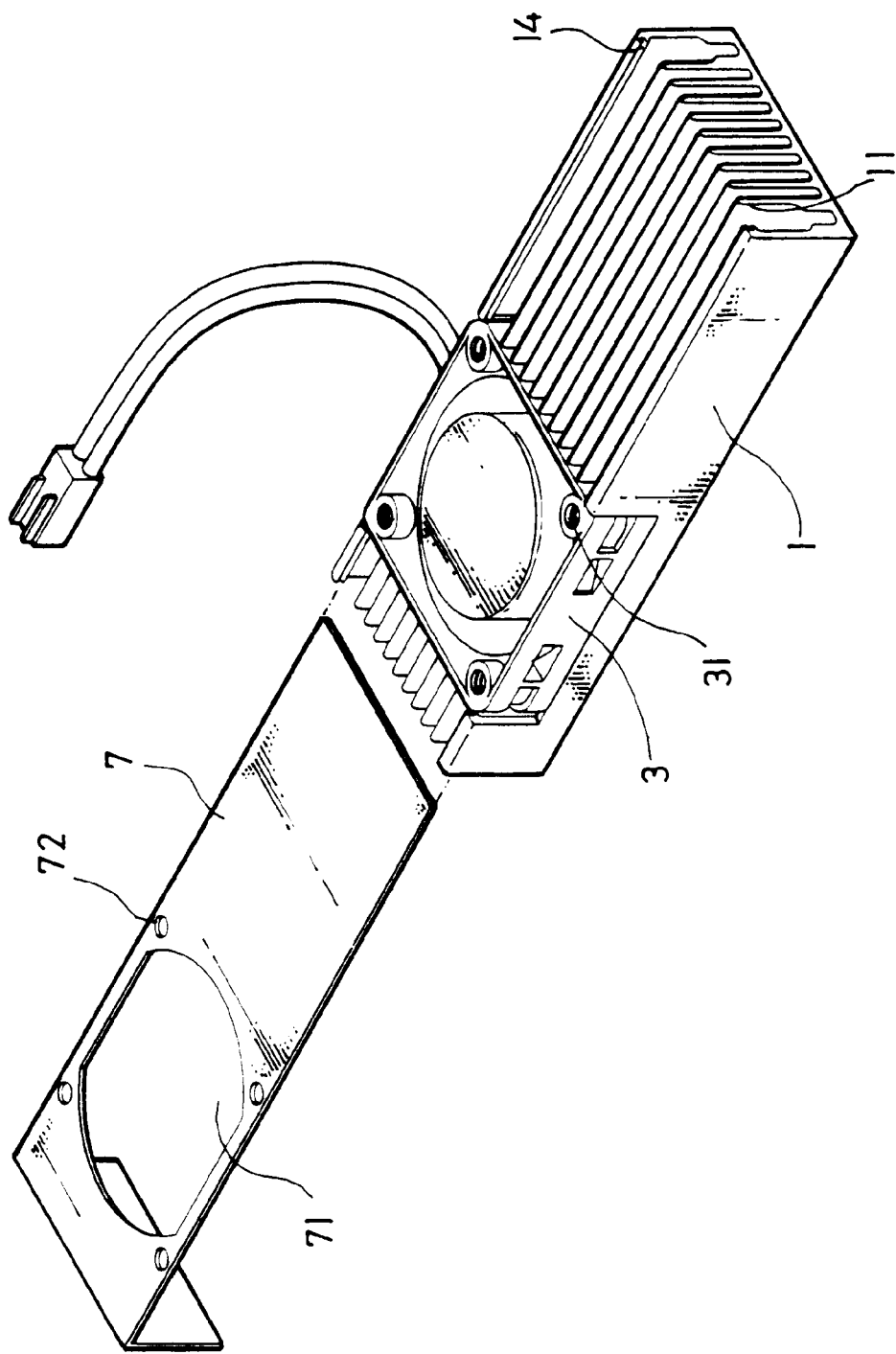
FIG. 4 is a schematic view of the second preferred embodiment of the present invention.

Referring to FIGS. 1 and 4, which show the second preferred embodiment of the present invention, an upper cover 7 may be provided above the heat sink body 1. The upper cover 7 is provided with an opening 71 at a position corresponding to the cooling fan 3. The periphery of the upper cover 7 is further provided with locking holes 72. As for the heat sink body 1, it is provided with an insert groove 14 at the top end of front and rear sides thereof, respectively. When the upper cover 7 is placed on top of the heat sink body 1, the two sides of the upper cover 7 can insert into the insert grooves 14 of the heat sink body 1 so that the upper cover 7 can be insertably arranged on the upper side of the heat sink body 1. Then, locking elements 73, such as bolts, are passed through the locking holes 72 into the securing holes 31 of the cooling fan 3, whereby the upper cover 7 and the cooling fan 3 can be both secured on the heat sink body 1.

In summary, the cooling fan 3 according to the present invention can be disposed directly on the upper side of the heat sink body 1 to thereby enhance heat dissipation efficiency. Besides, as the cooling fan 3 is at the same height as the cooling fins 11, the height of the housing of the electronic product will not be affected. In addition, only one cooling fan 3 is required to achieve ideal heat dissipation effects, so that cost is reduced.

Although the present invention has been illustrated and described with reference to the preferred embodiment thereof, it should be understood that it is in no way limited to the details of such embodiment but is capable of numerous modifications within the scope of the appended claims.

What is claimed is:

1. A heat sink assembly for installation above the integrated circuit elements of an electronic device, which assembly comprises:

a) a heat sink body for installation above the integrated circuit elements mounted on a circuit board having a pair of through holes formed in the board, the heat sink body including a plurality of equidistantly spaced cooling fins, a depression formed within the fins, a pair of threaded holes formed on opposite sides of the heat sink body, a pair of securing elements, each securing element having a first threaded end and a second end, the first threaded ends of the securing elements being engageable within the threaded holes of the heat sink body and the second ends for insertion through the pair of through holes of the circuit board and soldered to the circuit board;

b) a cooling fan secured within the depression, the fan and the cooling fins being of a same height, and the fan including an air outlet for directing cooling air through the fins; and c) a thermal conductive plate for disposition between the heat sink body and the integrated circuit elements to conduct heat from the circuit elements to the cooling fins for dissipation by cooling air directed through the fins from the outlet of the cooling fan.

2. The heat sink assembly of claim 1 wherein each securing element is a copper rod.

3. The heat sink element of claim 1 wherein the thermal conductive plate and the heat sink body are adhered together by a double-sided adhesive.

4. The heat sink assembly of claim 1 wherein the thermal conductive plate is thermal conductive silicon.

5. The heat sink assembly of claim 1 wherein the heat sink body includes an upper side, a cover disposed on the upper side, and the cover being provided with an opening positioned opposite to the cooling fan.

* * * * *